United States Patent [19]

Lin et al.

[11] Patent Number: 5,366,079
[45] Date of Patent: Nov. 22, 1994

[54] INTEGRATED CIRCUIT WAFER AND RETAINER ELEMENT COMBINATION

[75] Inventors: Chih-Ching Lin; Jiin C. Tai; Jane-Hong Huang; Ying-Kuang Peng, all of Hsin-Chu, Taiwan, Prov. of China

[73] Assignee: Taiwan Semiconductor Manufacturing Company, Hsin-chu, Taiwan, Prov. of China

[21] Appl. No.: 108,249

[22] Filed: Aug. 19, 1993

[51] Int. Cl.5 .................... B65D 73/02; B65D 85/42; B65D 85/02
[52] U.S. Cl. ................... 206/328; 206/334; 206/303; 206/516; 206/821
[58] Field of Search .............. 206/328, 334, 303, 309, 206/501, 500, 516, 821; 229/125.17, 125.28

[56] References Cited

U.S. PATENT DOCUMENTS

| 1,640,452 | 8/1927 | Knowlton | 206/500 |
| 2,483,063 | 9/1949 | Ray | 229/125.28 |
| 3,343,660 | 9/1967 | Bailey | 229/125.28 |
| 3,552,548 | 1/1971 | Wallestad | 206/328 |
| 3,672,495 | 6/1972 | Bauer et al. | 206/328 |
| 4,787,508 | 11/1988 | Wu et al. | 206/445 |
| 5,270,901 | 12/1993 | Nowak et al. | 206/328 |

FOREIGN PATENT DOCUMENTS 2838188  3/1980  Germany .............. 206/328

Primary Examiner—Paul T. Sewell
Assistant Examiner—Marie Denise Patterson
Attorney, Agent, or Firm—George O. Saile; Wolmar J. Stoffel

[57] ABSTRACT

The container has an enclosure member and a body member which together enclose a volume to accept wafers for storage, for handling, or for transportation. The body member has a base, and a plurality of spaced upright arcuate members supported on the base that are adapted to encircle wafers stacked on the base. An enclosure member has a circular top wall and a cylindrically shaped wall that is adapted to encompass and enclose the arcuate members. The retainer element has a flat central portion, and a plurality of flexible outwardly extending flaps depending from the central portion. The retainer element fits within the arcuate members of the body member with the end portions of the flaps positioned in the slots between the arcuate members.

11 Claims, 3 Drawing Sheets

INTEGRATED CIRCUIT WAFER AND RETAINER ELEMENT COMBINATION

BACKGROUND OF THE INVENTION

1. Field of the Invention

The present invention relates generally to integrated circuit (IC) wafer handling, and more particularly to a new combination of a IC wafer container and retainer element.

2. Description of the invention

The transport and storage of semiconductor wafers has presented more problems as the diameter of wafers has increased in size, and the circuitry has become more microminiturized. A container for storing and transporting IC wafers is described in U.S. Pat. No. 4,787,508. While the disclosed container is a major improvement over other known containers, in certain situations, damage can still occur. The most vulnerable wafers were those that do not have a top surface passivation layer. Any movement of the wafers within the container could potentially damage the very fragile metallurgy pattern on the surface of the wafer.

SUMMARY OF THE INVENTION

It is an object of the invention to provide an improvement in the handling and storage of IC wafers.

A further object of the invention is to provide a novel combination of a wafer container and a retainer element for stabilizing wafers in the container.

In accordance with the afore-mentioned objectives, there is presented a new combination of an integrated circuit wafer container and a retainer element for stabilizing wafers within the container. The container has an enclosure member and a body member which together enclose a volume to accept wafers for storage, for handling, or for transportation. The body member has a base, and a plurality of spaced upright arcuate members supported on the base that are adapted to encircle wafers stacked on the base. The enclosure member has a circular top wall and a cylindrically shaped wall that is adapted to encompass and enclose the arcuate members. A means is provided to secure the body member and the enclosure member together in sealed relation. The retainer element has a flat central portion, and a plurality of flexible outwardly extending flaps depending from the central portion, with the flaps inclined downwards from the plane of the central portion. The retainer element fits within the arcuate members of the body member with the end portions of the flaps positioned in the slots between the arcuate members.

DETAILED DESCRIPTION OF THE PREFERRED EMBODIMENT

Figure 1:
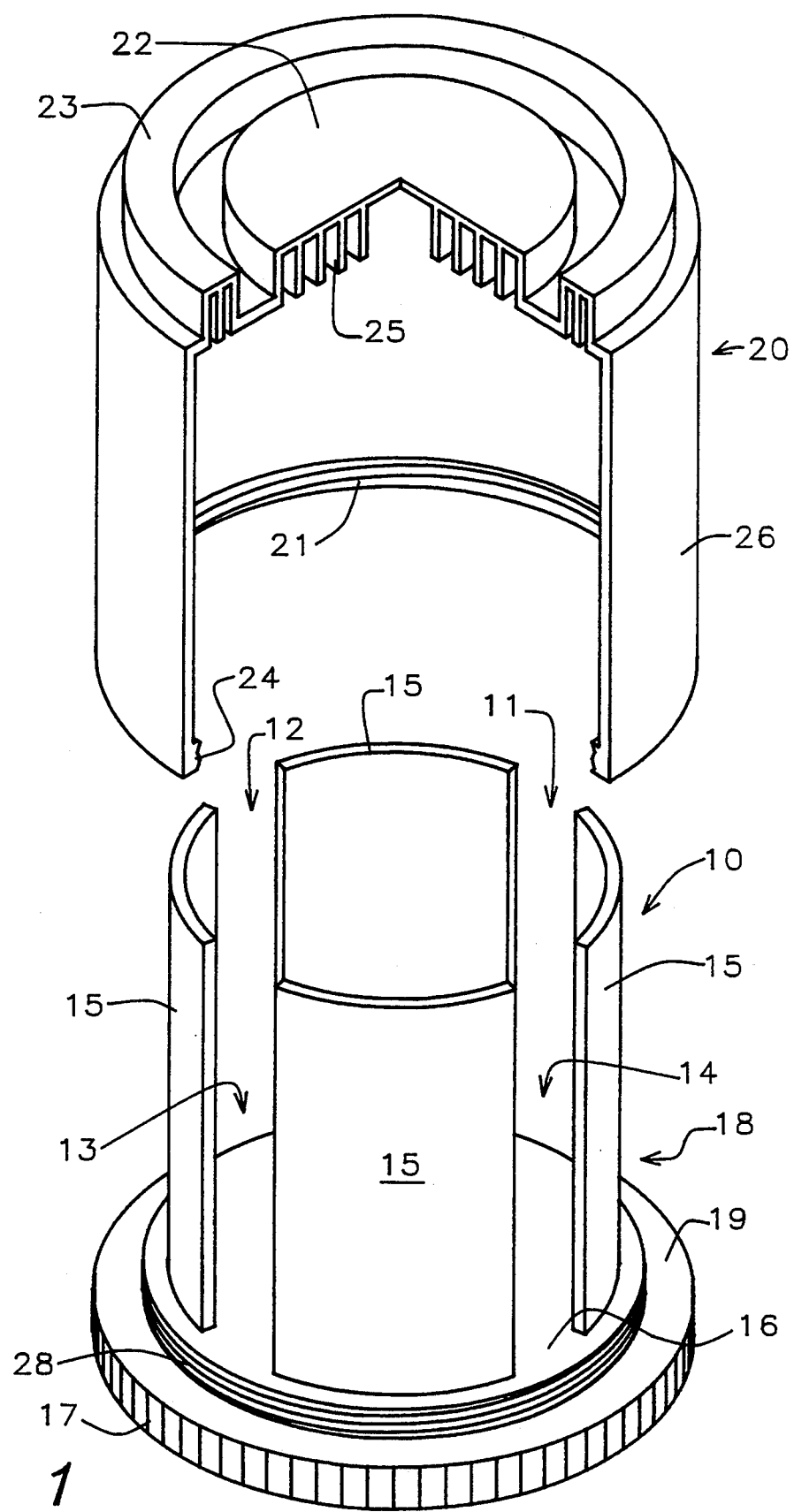
FIG. 1 is a perspective view of the wafer container element of the invention in exploded relation.

Referring now to the drawings, FIG. 1, shows a preferred embodiment of the wafer container element of the invention. The container is comprised of two parts, i.e. an enclosure member 20 and a body member 10. The body member 10 is formed of a hollow cylindrical body 18, a circular base 16, and a circular flange 17 having a larger diameter than that of base 16. The base 16 has a plurality of screw threads around the circumference thereof. Cylindrical body 18 is made up of a plurality of arcuate longitudinally directed members 15 supported on base 16, which are adapted to encircle semiconductor wafers stacked on the base, as more clearly shown in FIG. 2. Arcuate members 15 are spaced from each other to form slots 11, 12, 13, and 14. The enclosure member 20 has a top circular wall joined to a cylindrically shaped wall 26, that is adapted to encompass and enclose the cylindrical body 18, i.e. arcuate members of body member 10. Threaded portion 21 interfit with threaded portion 28 on base 16 to secure the body member 10 and enclosure member 20 in sealed relationship. The lower annular end surface 24 of enclosure member abuts surface 19 on body member 10. Annular recess 23 enclosure member 20 is adapted to interfit with a circular recess in flange 17 on base 16, (not shown) to permit vertical stacking of the containers. Protuberance 25 strengthen the wall 22 and are used to press the retainer element 30 against wafers stacked in body member 10.

Figure 3:
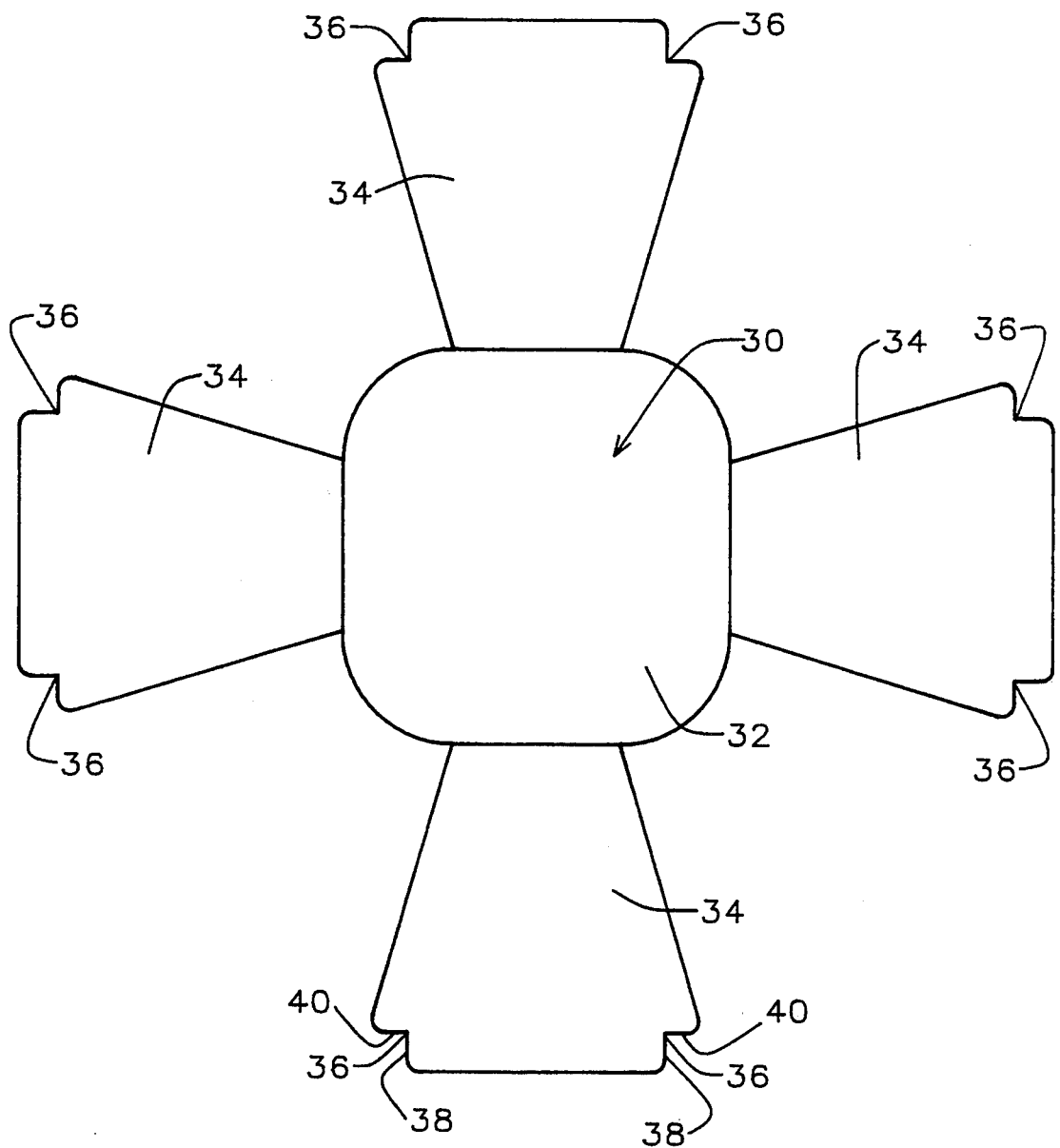
FIG. 3 is a top plan view of a preferred specific embodiment of the retainer element of the invention.
Figure 4:
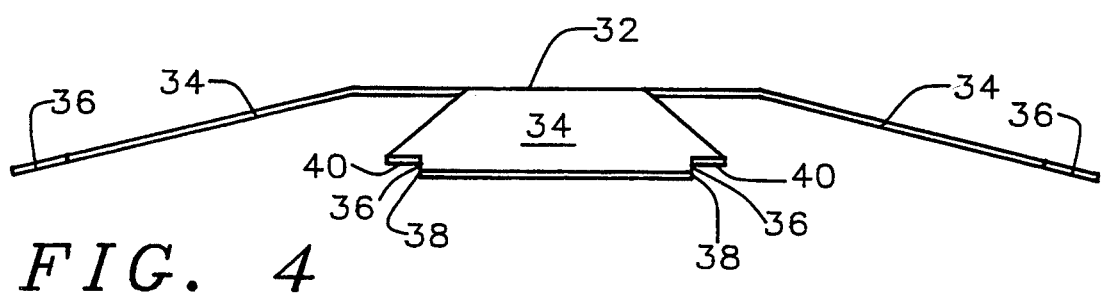
FIG. 4 is a side view of the retainer embodiment depicted in FIG. 3.

Referring now to FIG. 3, there is illustrated the retainer element 30 of the combination of the invention. Element 30 has a flat central portion 32 and a plurality of flexible radially extending flaps 34 depending from portion 32. The flaps 34 are downwards inclined from the plane of the flat central portion 32 as more clearly illustrated in FIG. 4. The inclination is in the range of about 11 to 13 degrees, more preferably of the order of about 12 degrees from the horizontal center plane 30. Alternatively, the flaps and central portion can be flat, that is substantially in the same plane, but this is not preferred. Each of flaps 34 are preferably provided with opposed notches 36 on the outer ends as most clearly shown in FIG. 3. The central portion and flaps are preferably of a uniform thickness, which is in the range of about 0.9 to 1.1 millimeters. In use, the surfaces 38 abut the side surfaces of arcuate walls 15 and fit in slots 11, 12, 13, and 14. The surfaces 40 assist in centering the retainer element 30 within the container. Retainer element 30 can be formed of any suitable material that provides the necessary flexibility. A preferred material is polypropylene. Other suitable materials are polyester, polyethylene, etc.

Figure 2:
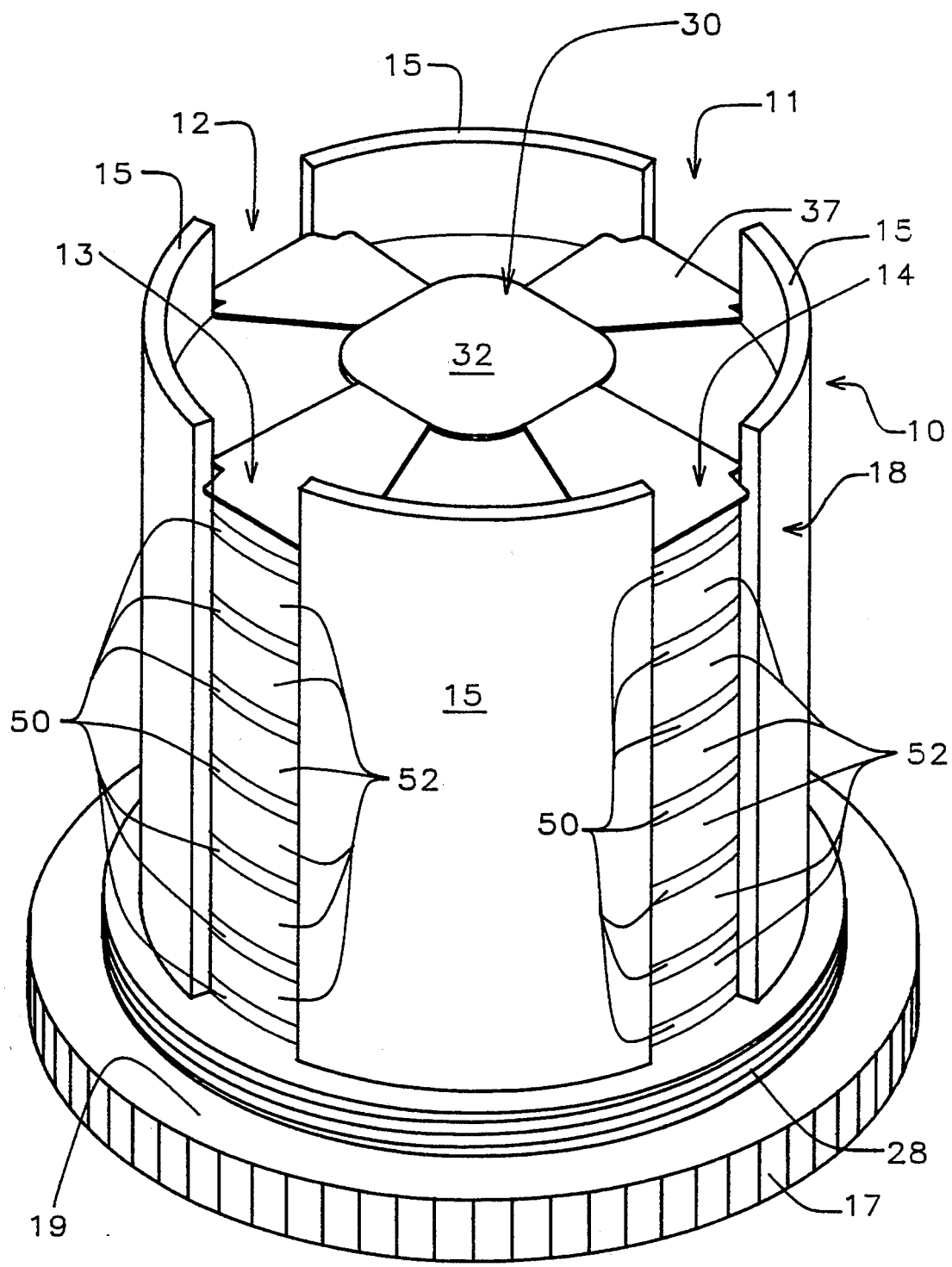
FIG. 2 is a perspective view of the body member of the wafer container, shown with a plurality of semiconductor wafers stored within, and with the retainer element mounted in position over the wafers.

In use wafers are stacked in body member 10 as indicated in FIG. 2. Suitable soft circular cushion elements 52, of the same diameter as the wafers, are positioned between the wafers. Cushion elements 52 are formed of any suitable material, such a foam plastic, etc. A preferred material is static dissipative material, such as plastic sponge. Also positioned between the wafers are flexible discs of either electrically conductive material or static dissipative material. The preferred material is lint free paper.

In use the semiconductor wafers 50, the cushion elements 52, and the electrically conductive discs are stacked in body member 10 until the top surface of the stack is at the bottom surface of the enclosure member, when in place. The retainer element 30 is placed on the top of the stack and the enclosure member secured. The retainer member will maintain a uniform pressure on the stack and also prevent rotation of the wafers within the containers, since the flaps interfit with the slots of the body member.

The smear and scratch problems when the retainer element is not used and the unexpected advantages in overcoming these problems when the retainer element is used may be seen from the following performance results. The Examples 1, 2, 3, and 4 show the defect counts on wafers in PPM, that is parts per million of scratch/smear where no retainer was used. The Examples 5, 6, 7, and 8 show the defect counts on wafers in PPM, that is parts per million of scratch/smear where a retainer 30 was used in the wafer container.

| Example | Defects (in PPM) |
|---------|------------------|
| 1       | 5343             |
| 2       | 27853            |
| 3       | 10753            |
| 4       | 5283             |
| 5       | 315              |
| 6       | 343              |
| 7       | 96               |
| 8       | 0                |

While the invention has been particularly shown and described with reference to the preferred embodiments thereof, it will be understood by those skilled in the art that various changes in form and detail may be made therein without departing from the spirit and scope of the invention.

What is claimed is:

1. The combination of an integrated circuit wafer container and a retainer element for stabilizing wafers within the container comprising:

a wafer container having an enclosure member and a body member, said body member having a base, a plurality of arcuate, longitudinally directed, members supported on said base adapted to encircle wafers stacked on the base, said arcuate members spaced from each other by longitudinal slots;

said enclosure member having a top wall and a cylindrically shaped wall to encompass and enclose said plurality of arcuate members, and means to secure said body member and said enclosure member together;

said retainer element having a flat central portion, and a plurality of flexible radially extending flaps depending from said central portion, said flaps inclined downwards from the plane of said flat central portion, each of said flaps of said retainer element has two opposed notches in the outer end that provide parallel surfaces which engage said slots between said arcuate members and abutting surfaces which engage the inside surfaces said arcuate members, said retainer element positioned within said arcuate members of said body member with the end 20 portions of said flaps positioned in said slots.

2. The combination container and retainer element of claim 1, wherein inclination of said flaps relative to said flat central portion is in the range of between about 11 to 13 degrees.

3. The combination container and retainer element of claim 1, wherein there is provided four slots between said arcuate members of container, and said retainer element has four flaps.

4. The combination container and retainer element of claim 1, wherein said retainer element is made of polypropylene.

5. The combination container and retainer element of claim 4, wherein the central portion and flaps have a uniform thickness.

6. The combination container and retainer element of claim 5, wherein the thickness of the flat central portion and the flaps of said retainer element is in the range of about 0.9 to 1.1 millimeters.

7. The combination container and retainer element of claim 1, wherein said means to secure said body member and said enclosure member is an annular thread portion on the base of said body member, and complimentary threads on the inside bottom end of said cylindrically shaped wall of said enclosure member.

8. The combination container and retainer element of claim 1, which further includes compressible circular pad elements for positioning between wafers in said container.

9. The combination container and retainer element of claim 8, which further includes circular sheets of static dissipative material for positioning between wafers in said container.

10. The combination container and retainer element of claim 9, wherein said static dissipative material is composed of plastic sponge material.

11. The combination container and retainer element of claim 9, wherein located between said wafers are sheets of lint free paper.

* * * * *